(12) United States Patent
Perigo et al.

(10) Patent No.: US 11,376,692 B2
(45) Date of Patent: Jul. 5, 2022

(54) ARTICLES OF MANUFACTURE AND METHODS FOR ADDITIVE MANUFACTURING OF ARTICLES HAVING DESIRED MAGNETIC ANISOTROPY

(71) Applicant: ABB Schweiz AG, Baden (CH)

(72) Inventors: Elio Alberto Perigo, Raleigh, NC (US); Ion C. Radu, Raleigh, NC (US); Darren D. Tremelling, Apex, NC (US); Ghanshyam Shrestha, Cary, NC (US)

(73) Assignee: ABB Schweiz AG, Baden (CH)

( * ) Notice: Subject to any disclaimer, the term of this patent is extended or adjusted under 35 U.S.C. 154(b) by 530 days.

(21) Appl. No.: 16/152,067

(22) Filed: Oct. 4, 2018

(65) Prior Publication Data
US 2020/0108463 A1    Apr. 9, 2020

(51) Int. Cl.
*B23K 26/34* (2014.01)
*H02K 1/22* (2006.01)
(Continued)

(52) U.S. Cl.
CPC ............ *B23K 26/34* (2013.01); *B23K 26/354* (2015.10); *B33Y 10/00* (2014.12); *B33Y 30/00* (2014.12);
(Continued)

(58) Field of Classification Search
CPC ...... B23K 26/34; B23K 26/354; B33Y 10/00; B33Y 80/00; H01F 27/00; H01F 41/02; H02K 1/22; H02K 15/02
(Continued)

(56) References Cited

U.S. PATENT DOCUMENTS 5,351,555 A * 10/1994 Garshelis ............... G01L 3/102
336/30
6,024,792 A    2/2000 Kurz et al.
(Continued)

FOREIGN PATENT DOCUMENTS

CN    102969362       3/2013
CN    106239918 A    12/2016
(Continued)

OTHER PUBLICATIONS

Garibaldi et al., Effect of Annealing on the Microstructure and Magnetic Properties of Soft Magnetic Fe—Si Produced via Laser Additive Manufacturing, published Aug. 30, 2017 in Scripta Materialia, No. 142 (2018) 121-125 (5 pages).
(Continued)

*Primary Examiner* — Jimmy Chou
(74) *Attorney, Agent, or Firm* — Leydig, Voit & Mayer, Ltd.

(57) ABSTRACT

A method for additive manufacturing of an article having a controlled magnetic anisotropy includes: forming a metallic layer of the article using additive manufacturing, the metallic layer having a magnetic anisotropy aligned in a first direction; forming a subsequent metallic layer of the article using additive manufacturing, the subsequent metallic layer having the magnetic anisotropy aligned in a second direction different from the first direction; and repeating the forming of subsequent metallic layers of the article to form at least a portion of the article, each subsequent metallic layer having the magnetic anisotropy aligned in a different direction than a previous metallic layer.

32 Claims, 10 Drawing Sheets

(51) Int. Cl.
*H01F 27/00* (2006.01)
*H01F 41/02* (2006.01)
*B33Y 10/00* (2015.01)
*B33Y 30/00* (2015.01)
*B33Y 70/00* (2020.01)
*B23K 26/354* (2014.01)
*H02K 15/02* (2006.01)
*B33Y 80/00* (2015.01)

(52) U.S. Cl.
CPC .............. *B33Y 70/00* (2014.12); *H01F 27/00* (2013.01); *H01F 41/02* (2013.01); *H02K 1/22* (2013.01); *H02K 15/02* (2013.01); *B33Y 80/00* (2014.12)

(58) Field of Classification Search
USPC .......................................... 219/121.66, 121.65
See application file for complete search history.

(56) References Cited

U.S. PATENT DOCUMENTS

| | | | | |
|---|---|---|---|---|
| 6,555,940 B2* | 4/2003 | Naito | ................... | H02K 1/2766 310/156.55 |
| 6,833,107 B2* | 12/2004 | Kuriyama | ................ | C21D 1/04 266/249 |
| 7,229,709 B2 | 6/2007 | Tsuchiya et al. | | |
| 7,640,648 B1* | 1/2010 | Rittenhouse | ........... | H02K 1/145 29/596 |
| 8,900,688 B2 | 12/2014 | Sakai et al. | | |
| 9,457,521 B2* | 10/2016 | Johnston | ................ | B29C 70/62 |
| 9,748,030 B2 | 8/2017 | Delette et al. | | |
| 10,703,052 B2* | 7/2020 | Erb | ....................... | B29C 64/393 |
| 2003/0164655 A1* | 9/2003 | Biais | .................... | H02K 1/2726 310/156.53 |
| 2004/0212269 A1* | 10/2004 | Decristofaro | ............. | H01F 3/02 310/216.065 |
| 2006/0054079 A1* | 3/2006 | Withey | ................... | C30B 29/02 117/108 |
| 2008/0188165 A1* | 8/2008 | Sakaguchi | ........... | B24B 19/028 451/259 |
| 2008/0296270 A1* | 12/2008 | Song | ..................... | B23K 26/03 219/121.63 |
| 2009/0001843 A1* | 1/2009 | Enomoto | ............... | H02K 1/145 310/257 |
| 2009/0211080 A1* | 8/2009 | Gowland | ........... | G01R 33/3873 29/602.1 |
| 2011/0052898 A1* | 3/2011 | Roberts | ................... | B29C 70/14 428/292.1 |
| 2013/0053471 A1* | 2/2013 | Studart | ..................... | C08J 5/24 523/115 |
| 2013/0056672 A1* | 3/2013 | Johnston | ................. | B29C 70/88 252/62.51 R |
| 2013/0090405 A1* | 4/2013 | Elimelech | .............. | C08K 7/00 977/750 |
| 2013/0154397 A1* | 6/2013 | Sullivan | ................. | H02K 1/141 310/12.18 |
| 2014/0217848 A1* | 8/2014 | Jurkovic | .............. | H02K 1/2766 310/156.53 |
| 2015/0273631 A1* | 10/2015 | Kenney | ................. | C22C 1/0416 419/53 |
| 2016/0031157 A1* | 2/2016 | Reep | ...................... | B29C 71/04 264/406 |
| 2016/0167303 A1* | 6/2016 | Petelet | ................... | B23K 15/02 264/497 |
| 2016/0307678 A1* | 10/2016 | Unosson | .............. | B23K 26/703 |
| 2016/0344274 A1* | 11/2016 | Jurkovic | .............. | H02K 1/2766 |
| 2016/0361897 A1* | 12/2016 | Hofmann | .................. | B32B 5/00 |
| 2016/0375492 A1* | 12/2016 | Bencher | ................. | B33Y 30/00 419/26 |
| 2017/0136699 A1* | 5/2017 | Erb | ....................... | B33Y 30/00 |
| 2017/0155309 A1* | 6/2017 | Jassal | ................. | B23K 15/0093 |
| 2017/0163106 A1* | 6/2017 | Jassal | ..................... | H02K 15/02 |
| 2017/0239719 A1* | 8/2017 | Buller | .................. | B23K 26/032 |
| 2018/0117818 A1* | 5/2018 | Paranthaman | ...... | B29C 48/0022 |
| 2018/0145552 A1* | 5/2018 | Hattori | ................ | H02K 1/2766 |
| 2018/0187984 A1* | 7/2018 | Manzo | ...................... | F28F 7/02 |
| 2018/0194674 A1* | 7/2018 | Cosijns | ................. | C03C 17/245 |
| 2018/0272600 A1* | 9/2018 | Shaarawi | .............. | C04B 35/111 |
| 2018/0277744 A1* | 9/2018 | Toko | ...................... | H01L 43/12 |
| 2018/0281284 A1* | 10/2018 | Elgar | .................... | B29C 64/364 |
| 2019/0207550 A1* | 7/2019 | Castagnini | ............. | H02K 1/146 |
| 2020/0005997 A1* | 1/2020 | Mccall | ................. | H01F 41/0273 |
| 2020/0036243 A1* | 1/2020 | Zhao | ...................... | H02K 21/145 |
| 2020/0118742 A1* | 4/2020 | Chmielus | ............... | B33Y 40/00 |
| 2020/0259377 A1* | 8/2020 | Gangi | ................... | H02K 1/2766 |
| 2020/0298493 A1* | 9/2020 | Wilds | ...................... | B33Y 50/02 |
| 2021/0320572 A1* | 10/2021 | Jassal | ................... | H02K 15/022 |

FOREIGN PATENT DOCUMENTS

| | | | | |
|---|---|---|---|---|
| WO | WO2015086705 | | 6/2015 | |
| WO | WO-2015086705 A1 * | | 6/2015 | ............. B33Y 10/00 |
| WO | WO-2015188175 A1 * | | 12/2015 | ......... B29C 67/0081 |
| WO | WO2016023961 | | 2/2016 | |
| WO | WO-2016209823 A1 * | | 12/2016 | ............. B33Y 10/00 |

OTHER PUBLICATIONS

International Search Report and Written Opinion, International Application No. PCT/US2019/54717, dated Feb. 3, 2020, 12 pgs.

* cited by examiner

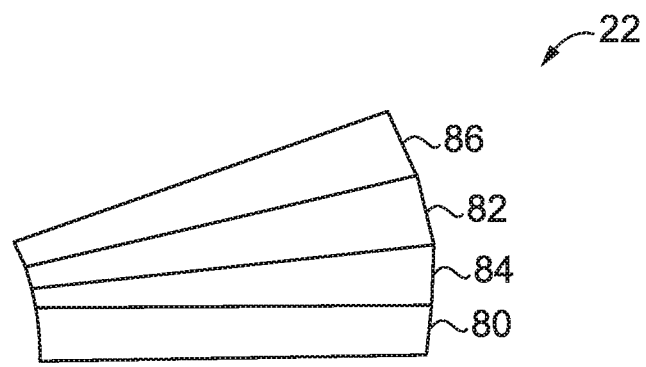
FIG. 5
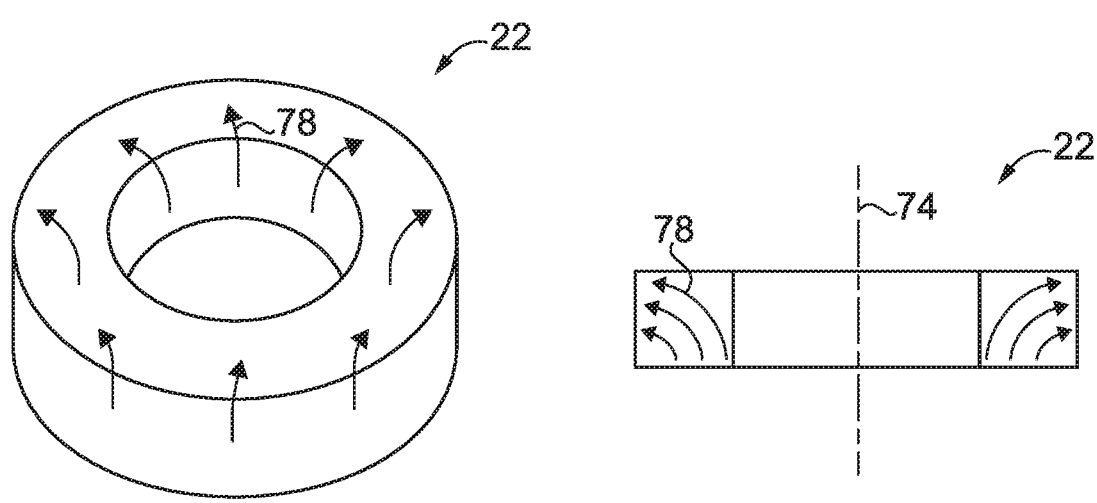
FIG. 6A
FIG. 6B

ARTICLES OF MANUFACTURE AND METHODS FOR ADDITIVE MANUFACTURING OF ARTICLES HAVING DESIRED MAGNETIC ANISOTROPY

TECHNICAL FIELD

The present application relates generally to articles of manufacture and more particularly, but not exclusively, to articles of manufacture and methods for additive manufacturing of articles having desired magnetic anisotropy.

BACKGROUND

Electrical machines, electrical systems and other systems that employ magnetics remain an area of interest. Some existing systems have various shortcomings, drawbacks and disadvantages relative to certain applications. For example, some articles of manufacture and methods for producing the articles have a magnetic anisotropy that may not be aligned in desired directions. Accordingly, there remains a need for further contributions in this area of technology.

SUMMARY

One embodiment of the present invention is a unique method for additive manufacturing of an article having a controlled magnetic anisotropy. Another embodiment is a unique method for additive manufacturing of an article having a nonlinear magnetic anisotropy. Another embodiment is a unique article of manufacture having a controlled magnetic anisotropy. Other embodiments include apparatuses, systems, devices, hardware, methods, and combinations for articles of manufacture and methods for additive manufacturing of articles having desired magnetic anisotropy. Further embodiments, forms, features, aspects, benefits, and advantages of the present application shall become apparent from the description and figures provided herewith.

BRIEF DESCRIPTION OF THE FIGURES

The description herein makes reference to the accompanying drawings wherein like reference numerals refer to like parts throughout the several views, and wherein:

FIG. 5 schematically illustrates some aspects of an article of manufacture, having insulating layers interspersed throughout metallic layers, formed by additive manufacturing in accordance with a method embodiment of the present invention.

FIGS. 6A and 6B schematically illustrate some aspects of an article of manufacture, having 3D lines or curves of magnetic anisotropy, formed by additive manufacturing in accordance with a method embodiment of the present invention.

DETAILED DESCRIPTION OF THE ILLUSTRATIVE EMBODIMENTS

Figure 1:
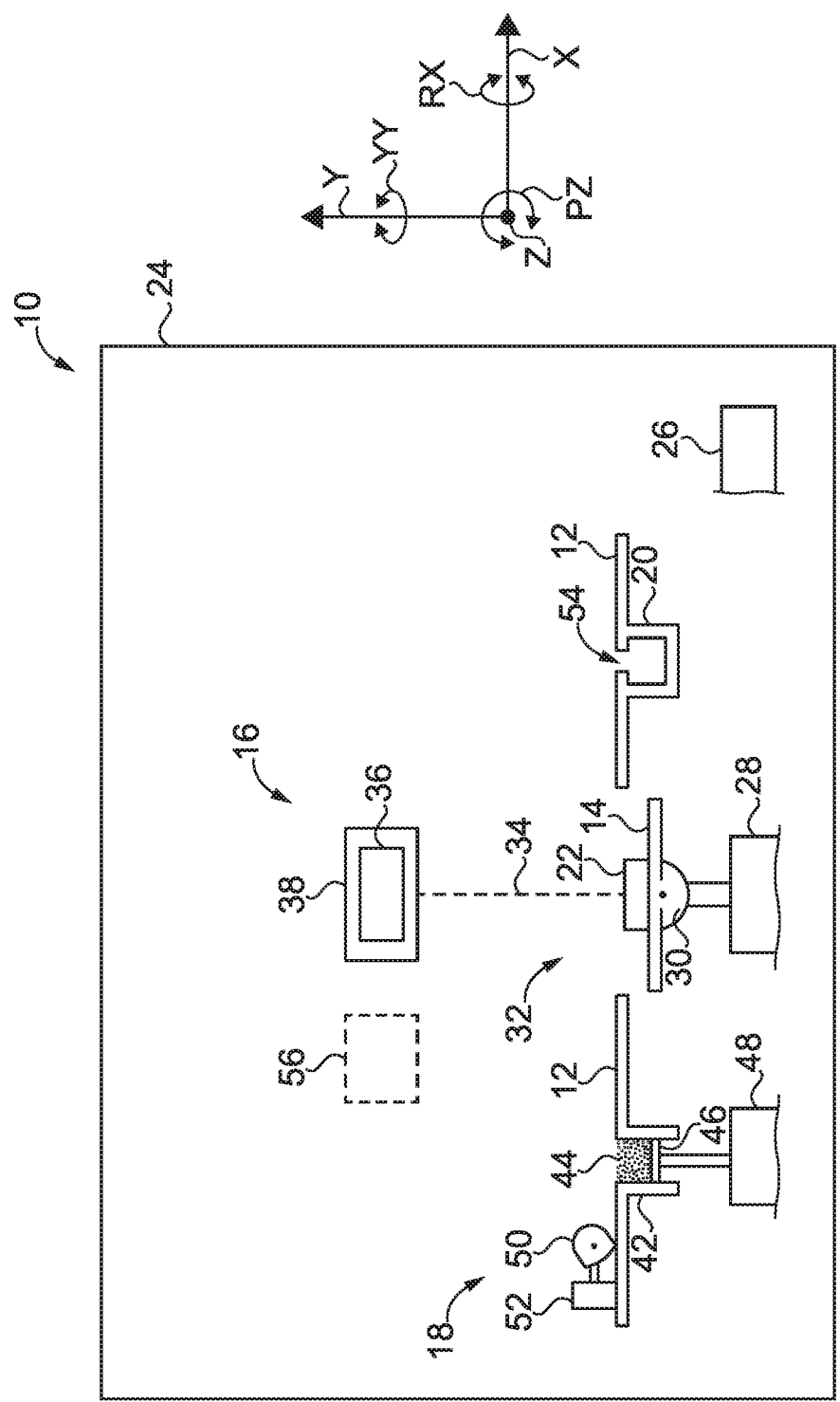
FIG. 1 schematically illustrates some aspects of a non-limiting example of a system for performing additive manufacturing to generate an article having magnetic anisotropy aligned in one or more desired directions in accordance with an embodiment of the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Referring to FIG. 1, some aspects of a non-limiting example of a system 10 for performing additive manufacturing, which is also known as solid freeform fabrication system or 3D printing system. In one form, system 10 is a selective laser melting (SLM) system. In other embodiments, system 10 may be another type of additive manufacturing system. Non-limiting examples of other types of systems that may be employed in accordance with embodiments of the present invention may include direct metal laser sintering (DMLS), selective laser sintering (SLS) or fused deposition modeling (FDM).

System 10 includes a work table 12, a build platform 14 disposed in an opening of work table 12 or between portions of work table 12; an energy beam system 16; a powder delivery system 18; and in some embodiments, an overflow container 20. System 10 is constructed to generate an article of manufacture, depicted in FIG. 1 generically as an article 22. In some embodiments, all or a portion of system 10 is disposed within an enclosure 24 constructed to provide or maintain a protective atmosphere around some or all of system 10 during manufacturing of article 22, e.g., an inert gas atmosphere or a vacuum, so that article 22 may be built in the protective atmosphere.

System 10 includes a controller 26 constructed to execute program instructions to control system 10 to perform additive manufacturing to build article 22 layer by layer. In one form, controller 26 is microprocessor based and the program instructions are in the form of software stored in a memory (not shown). However, it is alternatively contemplated that the controller and program instructions may be in the form of any combination of software, firmware and hardware, including state machines, and may reflect the output of discreet devices and/or integrated circuits, which may be co-located at a particular location or distributed across more than one location, including any digital and/or analog devices configured to achieve the same or similar results as a processor-based controller executing software or firmware based instructions or a programmable logic controller.

Build platform 14 includes a linear actuator 28 communicatively coupled to controller 26. Linear actuator 28 is constructed to translate upward and downward in a direction Y, e.g., a vertical direction, which is a build direction or a build axis, under the direction of controller 26. In various embodiments, build platform 14 also includes a rotational actuator 30 constructed to rotate build platform 14 about mutually perpendicular X and/or Z axes that are also perpendicular to the Y axis, that is, to rotate build platform 14 in respective roll direction RX and/or in pitch direction PZ, under the direction of controller 26. In the illustrations, the direction of the Z axes is into and out of the plane of view of the drawings unless otherwise noted. In some embodiments, rotational actuator 30 is also constructed to rotate build platform 14 about the build axis Y, that is, to rotate in a yaw direction YY, under the direction of controller 26. During the manufacturing of article 22, article 22 is built layer by layer as part of an additive manufacturing process, e.g., SLM, on a build surface 32. Build surface 32 may be the surface of build platform 14, or may be another surface, e.g., of a manufacturing or other fixture or of another portion of article 22, that is disposed on build platform 14. During operation, build platform 14 is maintained at a desired temperature in the range of 25° C. to 300° C., or more preferably 25° C. to 250° C. The temperature may vary with the needs of the application, and may be outside these ranges. In some embodiments, refrigeration may be employed to reduce the temperature of build platform 14 or build surface 32 to a desired temperature. The temperature may vary in some embodiments as required to maintain a desired heat extraction rate from the layers forming article 22. In one form, the heat extraction direction is downward along the build axis Y. In some embodiments, the heat extraction direction may be varied to obtain the desired magnetic anisotropy. Other operations may also be performed or modulated in order to maintain a desired heat extraction rate and/or direction, e.g., cooling each layer with a non-oxidizing gas in some embodiments in order to achieve a desired heat extraction rate.

Energy beam system 16 is communicatively coupled to controller 26. Energy beam system 16 is constructed to direct an energy beam 34 to sequentially melt layers of metallic powder (metallic powder 44) delivered powder delivery system 18 to form article 22 under the direction of controller 26. The term, "metallic" will be understood to mean "metal." In various embodiments, energy beam 34 is an electromagnetic radiation beam or a particle radiation beam. In one form, the metallic powder is a ferrous metal or a ferrous metal alloy. In a particular form the metallic powder is an Fe—Si alloy with an Si concentration of 1-10 wt. % more preferably 3-7 wt. %, and most preferably 5-7 wt. %, although other Fe—Si alloys with other Si concentrations may be used. In other embodiments, other metallic powders may be used in addition to or in place of an Fe—Si alloy. Non-limiting examples of other suitable metallic powders include Fe—Ni, Fe—Co, Fe—P and/or Fe—Al alloys. In one form, the mean particle size of metallic powder 44 is 10-100 micrometers, and in some embodiments more preferably 20-50 micrometers. The mean particle size and other particle size parameters may vary with the needs of the application, and may be outside these ranges.

Energy beam system 16 includes a beam source 36. In one form, beam source 36 is a laser or a laser beam source. In other embodiments, beam source 36 may be a particle radiation beam source, such as an electron gun constructed to generate an electron beam, e.g., an electron gun such as or similar to the electron guns used in electron beam welding.

Energy beam system 16 also includes a beam positioning system 38. Beam positioning system 38 is constructed to position and scan energy beam 34 at respective desired locations and in desired directions to strike a desired portion of build surface 32 or article 22 to selectively melt the metallic powder in a desired pattern to form a layer of article 22 having a desired shape. In one form, beam positioning system 38 includes a mirror scanner constructed to deflect energy beam 34, e.g., in the X and Z directions, an f-theta lens and a mirror constructed to deflect the energy beam 34 reflected by the mirror scanner through the f-theta lens to scan or position the energy beam 34. In other embodiments beam positioning system 38 also or alternatively includes X and Z axis and in some embodiments Y axis linear actuators to position energy beam 34 and scan energy beam 34 across desired paths or locations. In still other embodiments, other forms of beam positioning systems may also or alternatively be employed.

Energy beam system 16 is constructed to generate an energy beam 34 beam width or diameter at the metallic powder layer being melted in the range of 10 micrometers to 100 micrometers. The beam width or diameter may vary with the needs of the application, and may be outside this range in some embodiments. Energy beam power density, e.g., in the form of a laser, may be in the range of 20 W to 200 W, and in some embodiments preferably less than 100 W. The beam power density may vary with the needs of the application, and may be outside this range in some embodiments. Beam positioning system 38 is constructed to scan energy beam 34 across the surface of the metallic layer being melted at a scan speed of between 0.1 and 15 meters/second. The scan speed may vary with the needs of the application, and may be outside this range.

Powder delivery system 18 is communicatively coupled to controller 26, and is constructed to sequentially deposit layers of powder, e.g., metallic powder 44, onto build surface 32 and article 22 under the direction of controller 26 for melting by energy beam system 16. In some embodiments, powder delivery system 18 may also be constructed to deposit insulating material, e.g., in the form of a powder, such as soda lime glass or another insulating material, e.g., an organic material. In one form, powder delivery system 18 includes feed container 42, e.g., filled with the metallic powder 44, a plunger 46, a linear actuator 48 communicatively coupled to controller 26, a roller or scraper 50 with a linear actuator 52 communicatively coupled to controller 26. Linear actuator 48 is constructed to translate plunger 46 upward to feed metallic powder 44 to the surface of work table 12 under the direction of controller 26. Linear actuator 52 is constructed to roll or scrape the metallic powder 44 and push it toward and onto build surface 32 or article 22 at a desired thickness (height in build direction Y) under the direction of controller 26. Excess powder is directed by powder delivery system 18 into overflow container 20, which is constructed to hold excess powder 44. The powder 44 enters overflow container 20 via an opening 54 in work table 12. In some embodiments, powder delivery system 18 may also or alternatively employ a powder dispenser 56 communicatively coupled to controller 26, positionable above build surface 32 and article 22, and constructed to eject or deposit powder onto build surface 32 and article 22 under the direction of controller 26. For example, powder dispenser 56 may include one or more nozzles or openings constructed to eject or sprinkle powder, e.g., metallic powder 44 downward onto build surface 32 and article 22. Relative motion between powder dispenser 56, and build surface 32 and article 22, may be provided by one or more linear actuators coupled to powder dispenser 56 and directed by controller 26. Powder delivery system 18 is constructed to sequentially provide metallic powder 44 layers for melting to achieve a metallic layer thickness in the range between 10 micrometers and 1000 micrometers. The layer thickness may vary with the needs of the application, and may be outside this range in some embodiments. In some embodiments, the layer thickness may be 10-30 micrometers.

System 10 is constructed to generate a growth rate in the article 22 being formed at a desired value in the range between 10 cm$^3$/h and 500 cm$^3$/h. The growth rate may vary with the needs of the application, and may be outside this range in some embodiments. In some embodiments, the growth rate is a crystal growth rate. System 10 is constructed to generate a thermal gradient, e.g., across each metallic layer of article 22 being formed, in the range between 1000K/s and 1,000,000K/s. The thermal gradient may vary with the application, and may be outside this range in some embodiments.

Figure 2:
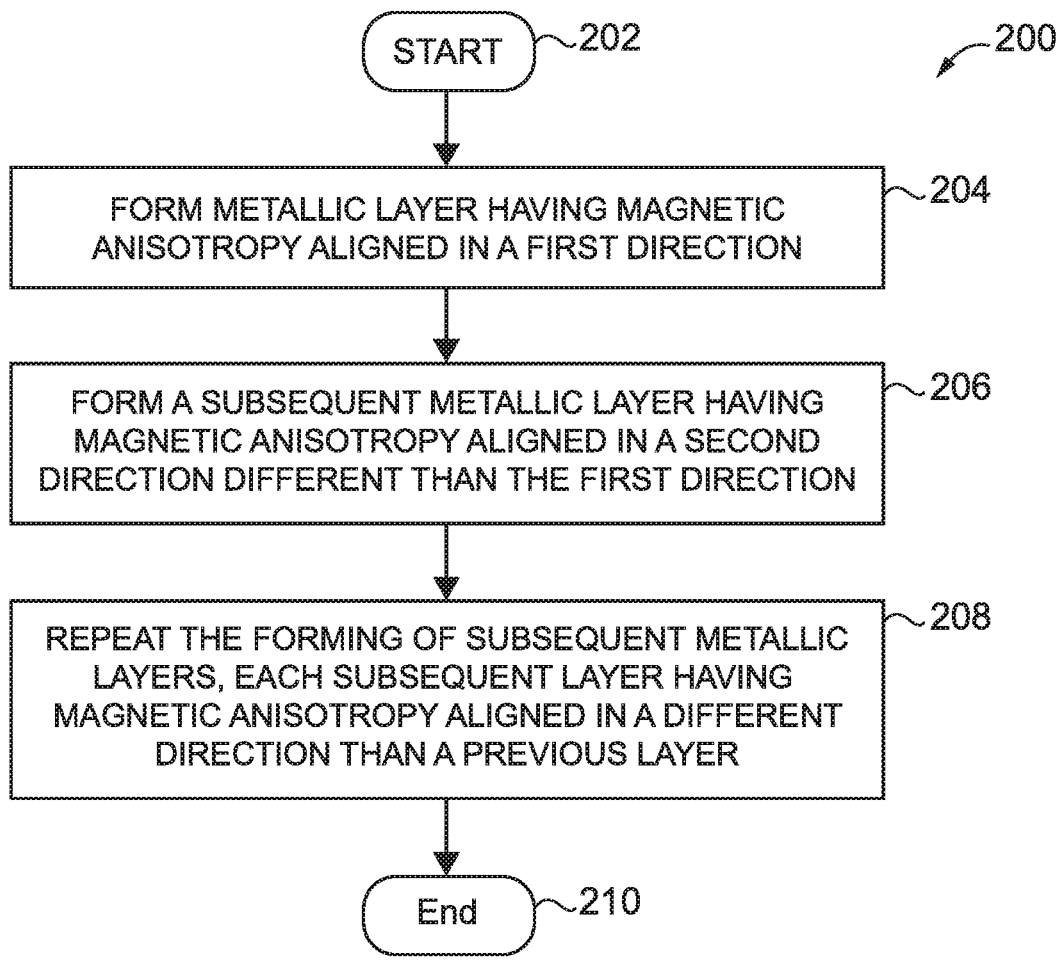
FIG. 2 is a flowchart illustrating some aspects of a method for manufacturing an article having a controlled magnetic anisotropy in accordance with an embodiment of the present invention.

Referring also to FIG. 2, some aspects of a non-limiting example of a method for manufacturing an article 22 having a controlled, e.g., nonlinear, magnetic anisotropy are illustrated in a flowchart 200. Embodiments of methods for forming an article in accordance with the present invention may be performed by controller 26 executing program instructions to direct the operations of system 10. By "nonlinear" it is meant that the orientation of magnetic anisotropy is not straight lines, but rather extends in two or three dimensions, e.g., continuous 2D or 3D lines or curves of magnetic anisotropy. Process flow begins at block 202.

Figure 3A:
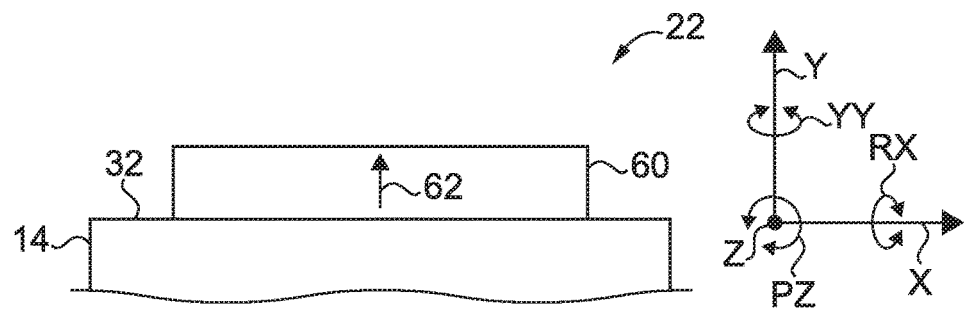
FIGS. 3A and 3B schematically illustrate some aspects of an article of manufacture being formed by additive manufacturing in accordance with a method embodiment of the present invention.

Referring also to FIG. 3A, at block 204 (shown in FIG. 2), a metallic layer 60 is formed using additive manufacturing to have a magnetic anisotropy aligned in a first direction. For example, a desired thickness of metallic powder 44 may be deposited or formed onto build surface 32, and energy beam 34 may be scanned in a desired pattern to melt the powder and form a layer 60 of a desired shape in the XZ plane, and having a desired layer thickness in the build direction Y. The magnetic anisotropy 62 is aligned in build direction Y. For example, build parameters may be varied so that the crystallographic axes of the metallic crystals forming the layer may be controlled to generate crystals having <001>, <010> or <100> crystallographic axis, each corresponding to an easy magnetization direction, aligned parallel with the build direction or build axis Y, thereby orienting the magnetic anisotropy with build direction Y. Such build parameters may include, but are not limited, the direction of energy beam 34, e.g., parallel or approximately parallel to the build direction, the heat extraction (e.g., heat extraction rate and/or direction), the layer thickness, the mean particle size of the metallic powder, the scan speed of the energy beam 34, the energy beam 34 power density and energy beam 34 diameter or dimension/width, the crystal growth rate or the layer growth rate, and the thermal gradient, e.g., across the layer being formed. Each pass of energy beam 34 may overlap with a previous pass to ensure consolidation of the formed layer and article 22.

Figure 3B:
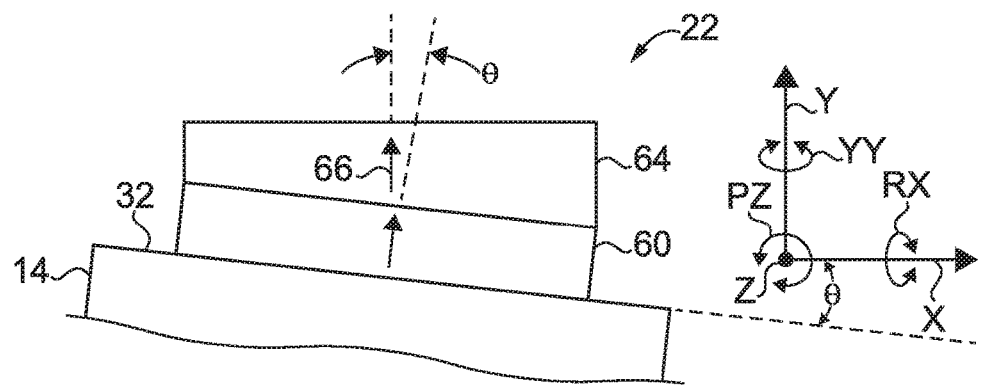

Referring to also FIG. 3B, at block 206 (shown in FIG. 2), a subsequent metallic layer 64 of the article 22 is formed using additive manufacturing, the subsequent metallic layer having magnetic anisotropy 66 aligned in a second direction different from the first direction. For example, build platform 14 may be rotated in the roll RX, and/or pitch PZ directions, and in some embodiments also in the yaw YY direction, and then a layer 64 may be build or added to the previous layer, again resulting in a magnetic anisotropy 66 aligned with the build direction Y. For example, in the depiction of FIG. 3B, the rotation in the pitch PZ direction about the Z yields is an angle Θ relative to the X axis or direction. Since the build platform 14 is rotated prior to forming layer 64, and since the layer 64 has a magnetic anisotropy direction aligned with the build axis Y, the magnetic anisotropy of layer 64 is in a different direction than the magnetic anisotropy of layer 60 by the angle Θ. In some embodiments, alternate layers may be scanned perpendicular to each other, e.g., so that the scanning direction alternates for each layer.

At block 208 (shown in FIG. 2), the process of block 206 is repeated, e.g., with each subsequent metallic layer having a magnetic anisotropy aligned in a different direction than a previous metallic layer, until article 22 is formed with a two or three dimensional anisotropy. In some embodiments, the processes of blocks 204 and 206 may be performed to create portions of article 22 that are subsequently metallurgically bonded to each other to form article 22. For example, with reference also to FIGS. 4A and 4B, an article 22 in the form of a flux collector, e.g., a flux collector ring, may be formed by performing the process of blocks 204-208 to create a 180° ring portion 68 and a 180° ring portion 70, which are metallurgically bonded together, e.g., diffusion bonding, e.g., at part lines 71, to achieve the a flux collector, e.g., a flux collector ring having a magnetic anisotropy 72 parallel to the axis 74 of the flux collector ring. This process also generates a continuous two dimensional circular or circumferential magnetic anisotropy 76 in the flux collector because the <001>, <010> and <100> crystallographic axes corresponding to the easy magnetization directions are mutually perpendicular and because build platform 14 was rotated between each layer, providing a magnetic anisotropy in each layer angled slightly relative to previous and subsequent layers, yielding the circular magnetic anisotropy, i.e., a magnetic anisotropy defines by circumferential or circular curves or a circular or circumferential magnetic anisotropy, which are lines of continuous 2D magnetic anisotropy. Flux collectors, e.g., flux collector rings, are used in large core transformers, large, medium and small power transformers, and shunt reactors in the electrical power generation and transmission and distribution industry, e.g., for national, regional or local electrical grids, and for industrial electrical power grids and some building power grids, to control leakage flux from the transformers. For example, flux collectors create a preferential magnetic circuit (with low magnetic reluctance) for the leakage flux, and collect the leakage flux from outside the transformer core and deliver the flux into the transformer core, which reduces load losses, stray losses, eddy losses in the windings, leakage impedances, hot spots in the windings, and reduces maximum temperatures in structural parts (e.g., core clamps and flitch plates) and in the transformer windings.

In some embodiments, one or more adjacent layers or groups of adjacent layers may be formed having a magnetic anisotropy aligned in the same direction as one or more previous layers. In some embodiments, magnetic anisotropy 72 (but not magnetic anisotropy 76) may be achieved by building each layer in the shape of a ring, without the need for metallurgically bonding two half-rings together.

Article 22 may be sintered and/or annealed after being built by additive manufacturing using system 10. The process of flowchart 200 ends at block 210.

In some embodiments, an insulating layer may be formed over a previous metallic layer, followed by a metallic layer being formed over the insulating layer to achieve an article 22 having alternating metallic and insulating layers or insulating layers otherwise interspersed throughout the metallic layers. For example, referring also to FIG. 5, metallic layers 80 and 82 are alternated with insulating layers 84 and 86. The insulating layers may be formed by additive manufacturing, e.g., using system 10, or may be formed by another process. In one form, the insulating layers are electrically insulating layers. The insulating material may be, for example, a soda lime glass, or may be other insulating materials in addition to or in place of soda lime glass.

Figures 4A, 4B:
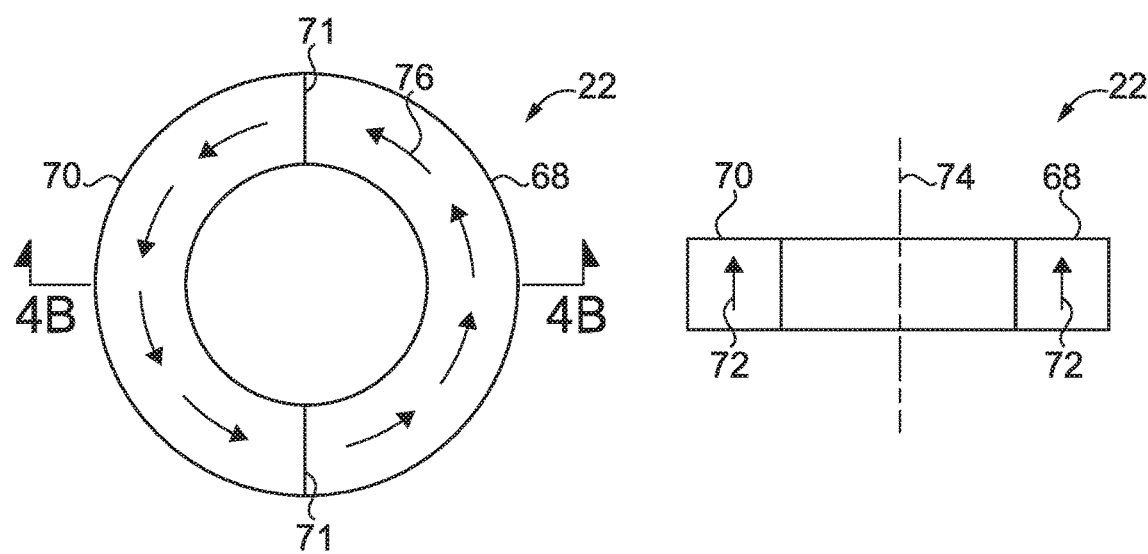
FIGS. 4A and 4B schematically illustrate some aspects of an article of manufacture formed by additive manufacturing in accordance with a method embodiment of the present invention.

Referring also to FIGS. 6A and 6B, in some embodiments, the methods described herein may be used to provide a three dimensional magnetic anisotropy, e.g., 3D continuous lines of magnetic anisotropy 78, whereas the embodiment of FIG. 4A is two dimensional continuous lines of magnetic anisotropy 76. In other embodiments, the magnetic anisotropy obtained by the methodology described herein may be one dimensional or the article may include both 1D and 2D continuous lines of magnetic anisotropy, such as the flux collector ring of FIGS. 4A and 4B. In still other embodiments, multiple 1D continuous lines of magnetic anisotropy may be obtained, e.g., perpendicular lines of magnetic anisotropy.

Figure 7:
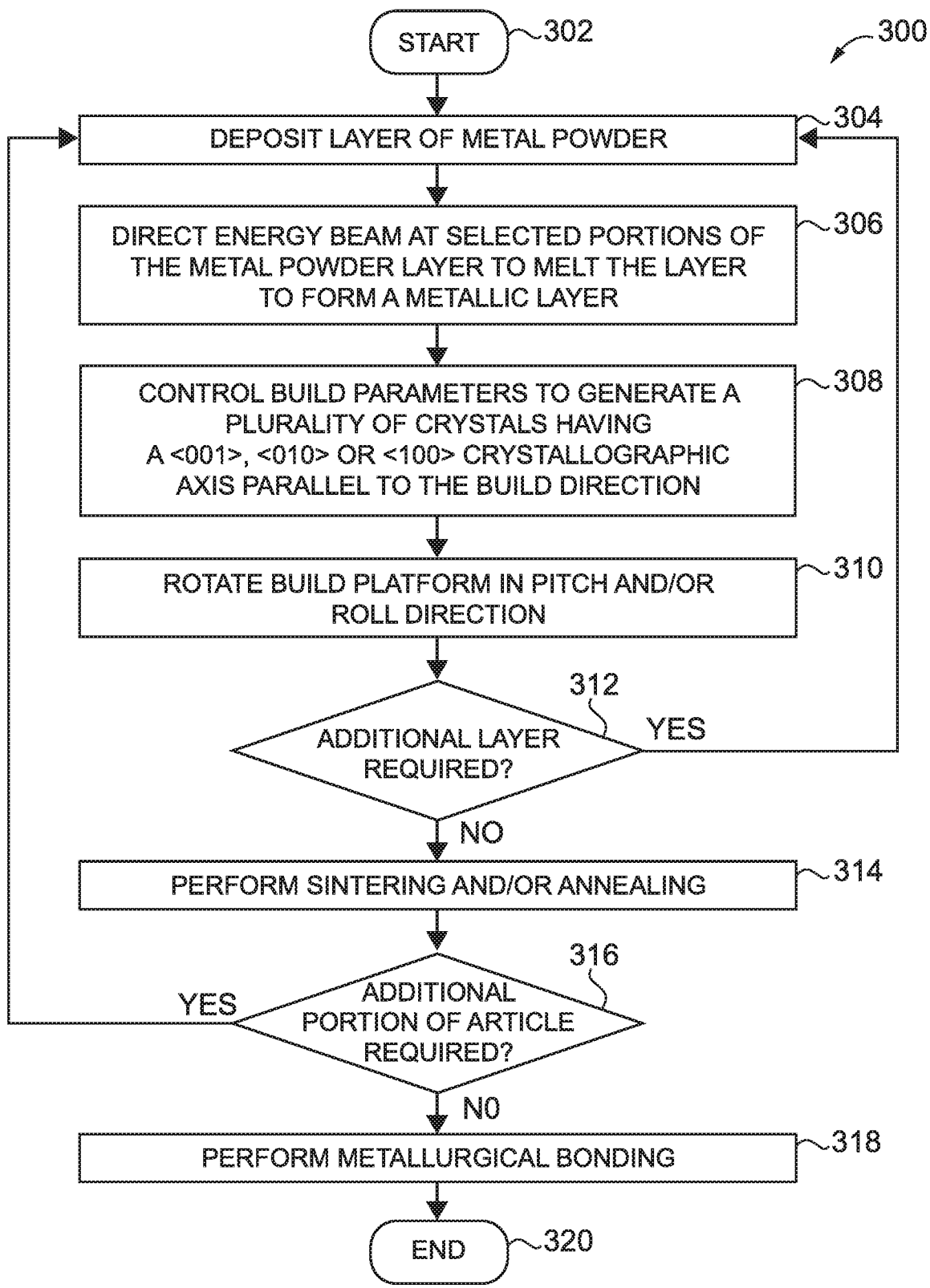
FIG. 7 is a flowchart illustrating some aspects of a non-limiting example of a method for manufacturing an article having a nonlinear magnetic anisotropy in accordance with an embodiment of the present invention.

Referring also to FIG. 7, some aspects of a non-limiting example of a method for manufacturing an article 22 having a nonlinear magnetic anisotropy are illustrated in a flowchart 300. Embodiments of methods for forming an article in accordance with the present invention may be performed by controller 26 executing program instructions to direct the operations of system 10. Process flow begins at block 302.

At block 304, a layer, e.g., layer 60 of metallic powder is deposited, the layer extending in build direction Y to achieve a desired thickness in build direction Y. For the initial layer, the metallic powder is deposited onto build surface 32 on build platform 14. Subsequently layers are deposited onto previous layers of powder and/or layers of melted powder forming part of article 22.

At block 306, energy beam 34 is directed at selected portions of the metal powder layer to melt the powder layer to form a metallic layer having a desired shape, e.g., extending in the X and Z directions.

At block 308, build parameters are controlled, e.g., before, during and/or after the operation of block 306, to generate a plurality of crystals in the metal layer, the crystals having a <001>, <010> or <100> crystallographic axis parallel to the build direction Y. The build parameters may include, but are not limited to, the direction of energy beam 34, the heat extraction (e.g., heat extraction rate and/or direction), the layer thickness, the mean particle size of the metallic powder, the scan speed of the energy beam 34, the energy beam 34 power density and energy beam 34 diameter or dimension/width, the crystal growth rate or the layer growth rate, and the thermal gradient, e.g., across the layer being formed. In one form, energy beam 34 is parallel or substantially parallel to build direction or axis Y.

At block 310, build platform 14 is rotated in pitch direction PZ and/or roll direction RX. In some embodiments or for some applications, build platform 14 may also be rotated in yaw direction YY. An example of a rotation in pitch direction PZ is illustrated in FIG. 3.

At block 312, if an additional layer is required to complete article 22 or to complete a portion of article 22 that is to be bonded to one or more other portions of article 22 to complete article 22 (e.g., a quarter circle or quarter ring, a half circle or half ring, or pie shape or other portion of article 22), process flow process flow proceeds back to block 304. Otherwise, process flow proceeds to block 314.

At block 314, sintering and/or annealing of article 22 or the completed portion of article 22 is performed.

At block 316, if an additional portion of article 22 is required, process proceeds back to block 304 to begin the process of making the next portion of article 22. If not, process flow proceeds to block 318.

At block 318, if required, completed portions of article 22 are bonded together, e.g., diffusion bonded. For example, the 180° ring portion 68 and the 180° ring portion 70 are bonded together to achieve the article 22 depicted in FIGS. 4A and 4B in the form of a flux collector, e.g., a flux collector ring. In some embodiments, insulating layers may be deposited or formed over a metallic layer, e.g., as described above, and then a metallic layer may be deposited and melted over the insulating layer, and the process repeated to generate alternatingly disposed insulating layers and metallic layers, or with including metallic layers interspersed with a greater, equal or lesser number of insulating layers. Process flow ends at block 320.

Figure 8A:
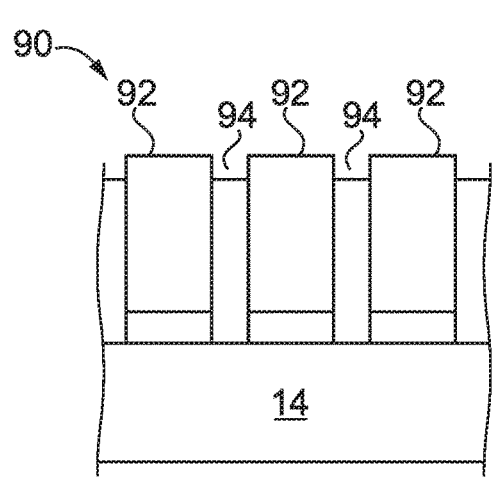
FIGS. 8A-8D schematically illustrate some aspects of the additive manufacture of an article in the form of a rotor for an electrical machine in accordance with an embodiment of the present invention.

Referring to FIGS. 8A-8D, in some embodiments, one or more metallic layers may have one or more open slots extending at least partially through the metallic layer. In some embodiments, some or all of the open slots may be filled with an insulating material, e.g., soda lime glass or another material, e.g., using system 10 to apply the insulating material via additive manufacturing. For example, as depicted in FIG. 8A, a layer 90 is subdivided into a plurality of metallic lengths 92 separated by a plurality of open slots 94.

Figure 8B:
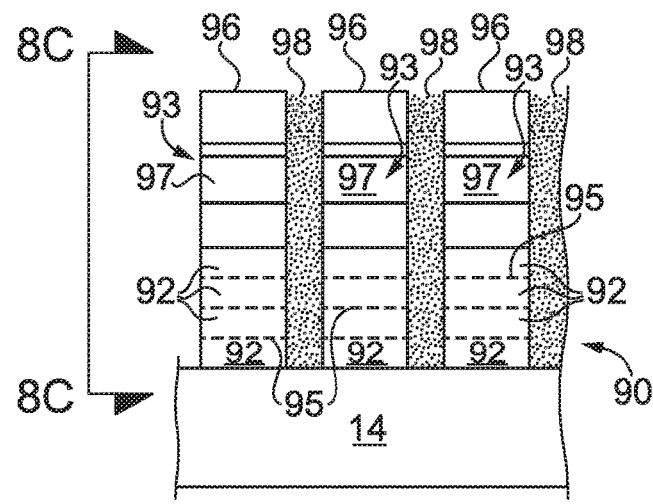

Referring to FIG. 8B, subsequent metallic layers are then formed upon previous layers, forming a stack of metallic layers, each metallic layer having a plurality of open slots separating a plurality of metallic lengths, wherein the open slots of each layer are aligned with the open slots of other layers. The magnetic anisotropy extends continuously through the metallic portions of the metallic layers that are built on top of each other. Open slots 94, are filled with the insulating material. Some layers or metallic lengths 92 may include one or more open slots 93 formed along the length of such metallic lengths 92 that are not filled with insulating layers, but rather, may form air gaps 97. As depicted in FIG. 8B, the metallic lengths 92 are aligned with the metallic lengths 92 of other layers, forming laminations 96 (oriented vertically in the view of FIG. 8B) interspersed with insulating layers 98 (also oriented vertically in the view of FIG. 8B) formed by filling open slots 94 with the insulating material, e.g., layers of insulating material deposited and melted using system 10. In the illustration of FIG. 8B, which is shown from the a similar perspective as that of FIG. 8A, a plurality of layers have been built on top of layer 90, wherein a plurality of metallic lengths 92 are disposed on top of each other to form the laminations 96. Dashed lines 95 represent the approximate location for the interfaces between metallic lengths 92 in the stack of metallic lengths, e.g., as between layers. Each stack of metallic lengths 92 forms a lamination 96, each lamination 96 being formed layer by layer into a unitary structure.

Figure 8C:
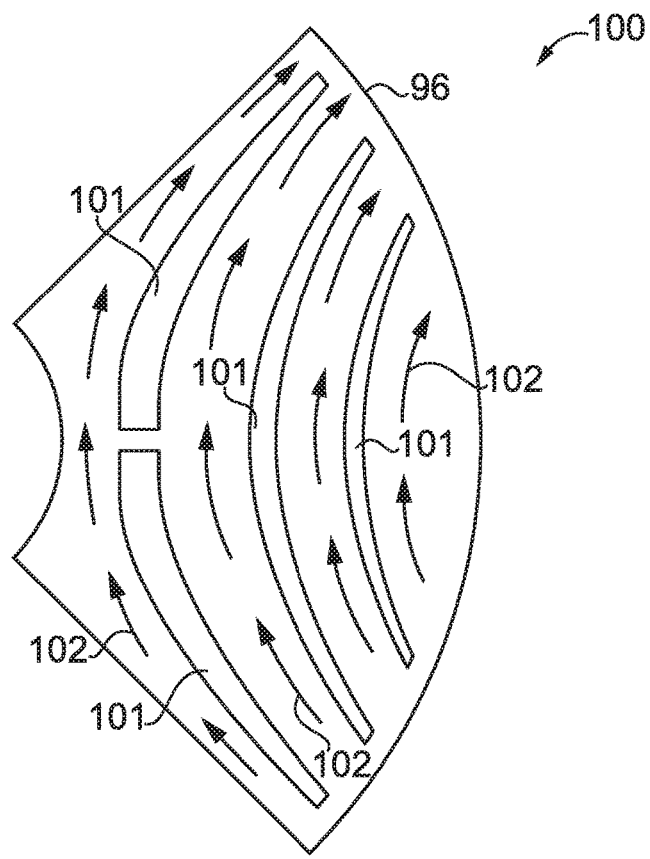
Figure 8D:
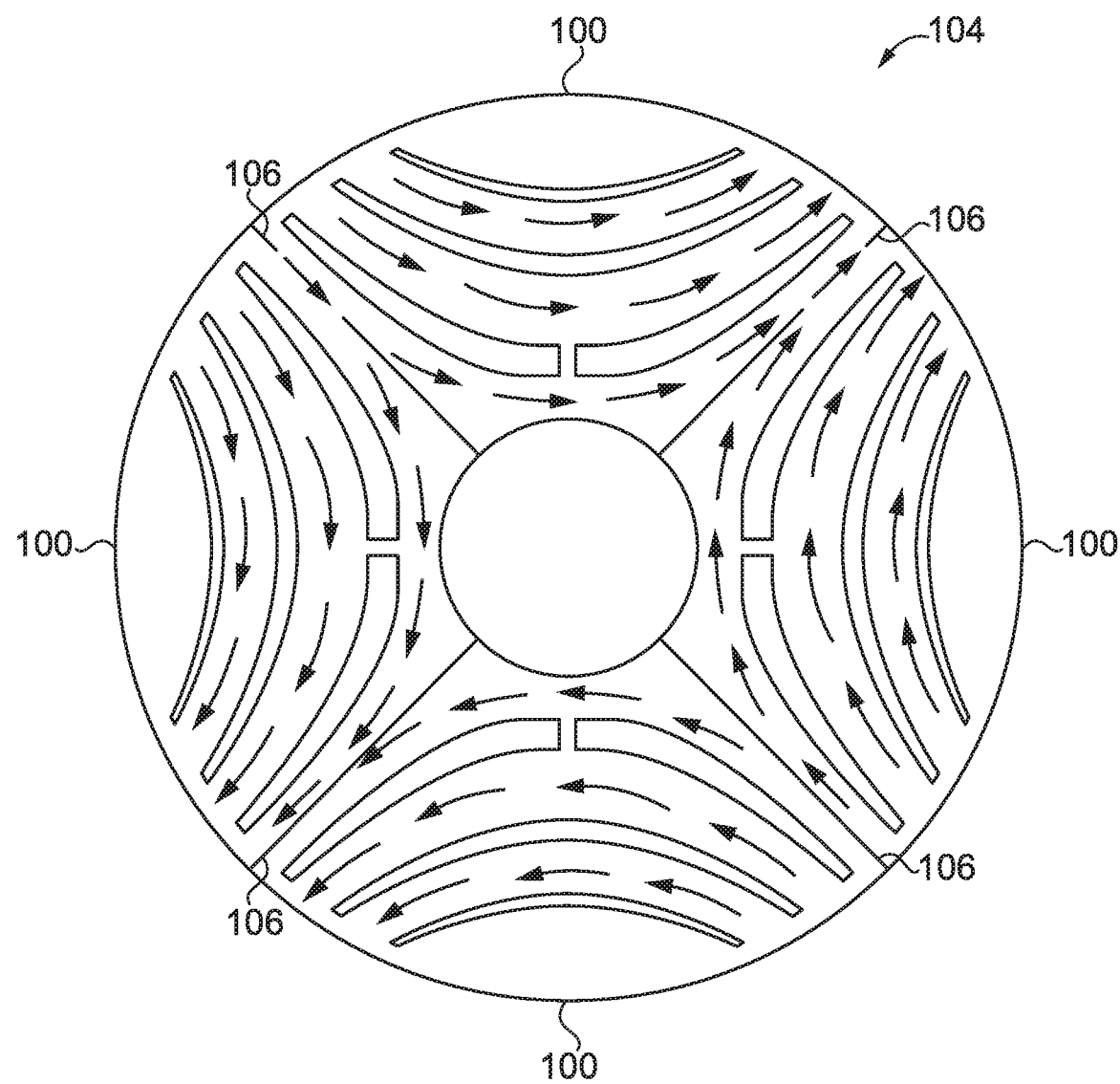

Each lamination 96 with interspersed insulating layers 98 form a 90° arc portion or quarter circle portion of a rotor, e.g., as depicted in FIG. 8C. The laminations 96 are interspersed with layers of insulator 98, and form a quarter circle portion 100 of a rotor for an electrical machine, e.g., a rotor for a synchronous reluctance motor, e.g., having openings 101 formed by the air gaps 97. The thickness of the laminations 96 and the thickness of insulating layers 98 may vary with the needs of the application. In some embodiments, the thickness of the laminations may be greater than the thickness of the insulating layers. The magnetic anisotropy in each lamination is in the form of continuous 2D curves 102. The process described herein may be used to create four such quarter circle portions 100, which may be metallurgically bonded together, e.g., at part lines 106, to form a rotor 104 for an electrical machine, such as a synchronous reluctance rotor for a synchronous reluctance motor and/or generator, e.g., as depicted in FIG. 8D, or to form a rotor for another type of electrical machine. The non-limiting example of FIGS. 8C and 8D illustrates a 4-pole motor. The arc angle (of the arc portion) changes with the number of poles, e.g., may be 360° divided by the number of poles. The non-limiting example of FIGS. 8C and 8D illustrates a synchronous reluctance motor, although other rotor configurations may be formed in other embodiments, and may or may not include bridges and/or webs.

Figure 9:
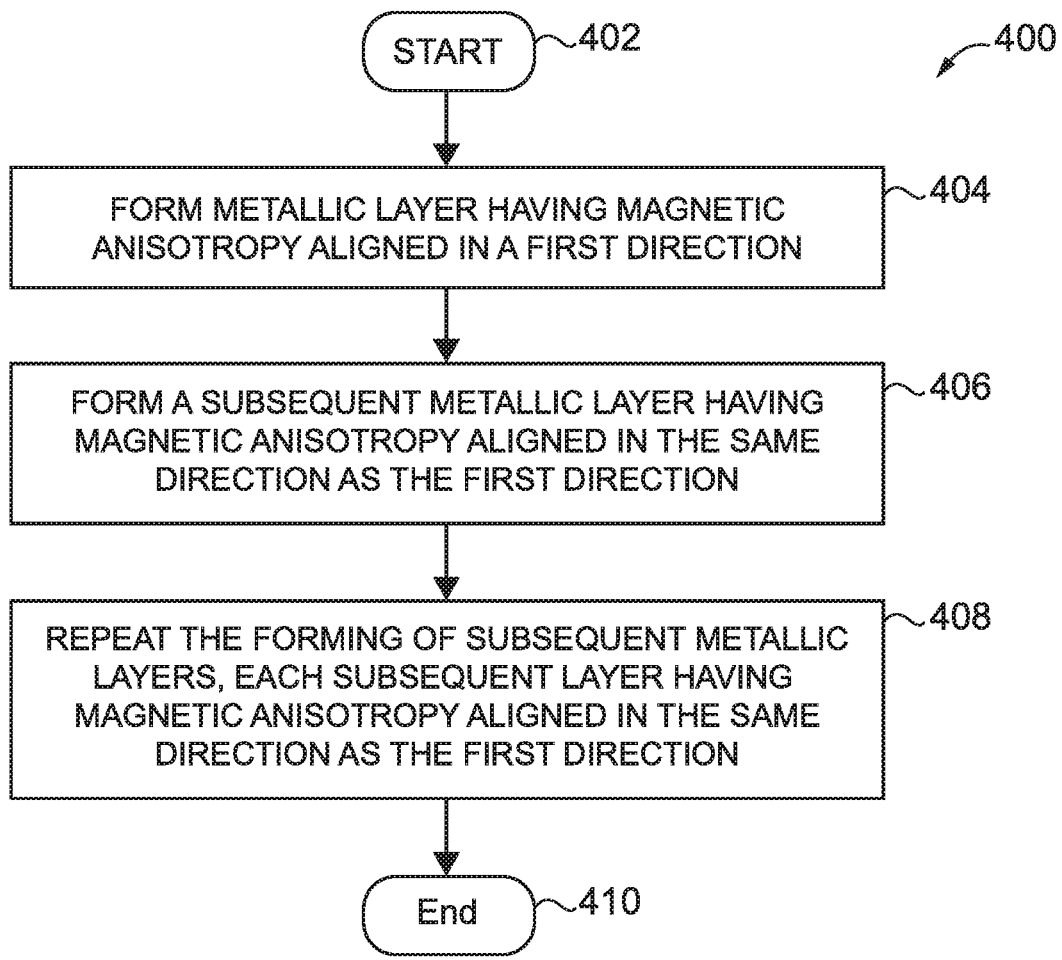
FIG. 9 is a flowchart illustrating some aspects of a non-limiting example of a method for manufacturing an article having a controlled magnetic anisotropy in accordance with an embodiment of the present invention.

Referring to FIG. 9, some aspects of a non-limiting example of a method for manufacturing an article 22 having a controlled magnetic anisotropy are illustrated in a flowchart 400. Embodiments of methods for forming an article in accordance with the present invention may be performed by controller 26 executing program instructions to direct the operations of system 10. Process flow begins at block 402.

At block 404, a metallic layer 60 is formed using additive manufacturing to have a magnetic anisotropy aligned in a first direction. For example, a desired thickness of metallic powder may be deposited or formed onto build surface 32, and energy beam 34 may be scanned in a desired pattern to melt the powder and form a metallic layer of a desired shape, and having a desired layer thickness in the build direction Y. The magnetic anisotropy is aligned in build direction Y. For example, build parameters may be varied so that the crystallographic axes of the metallic crystals forming the layer may be controlled to generate crystals having <001>, <010> or <100> crystallographic axis, each corresponding to an easy magnetization direction, aligned parallel with the build direction or build axis Y, thereby obtaining lines of magnetic anisotropy aligned with build direction Y. Such build parameters may include, but are not limited, the direction of energy beam 34, e.g., parallel or approximately parallel to the build direction, the heat extraction (e.g., heat extraction rate and/or direction), the layer thickness, the mean particle size of the metallic powder, the scan speed of the energy beam 34, the energy beam 34 power density and energy beam 34 diameter or dimension/width, the crystal growth rate or the layer growth rate, and the thermal gradient, e.g., across the layer being formed. Each pass of energy beam 34 may overlap with a previous pass to ensure consolidation of the formed layer and article 22.

At block 406, a subsequent metallic layer of the article 22 is formed using additive manufacturing, the subsequent metallic layer having magnetic anisotropy aligned in the first direction, i.e., the magnetic anisotropy aligned in the same direction as for the previous metallic layer. In some embodiments, alternate layers may be scanned perpendicular to each other, e.g., so that the scanning direction alternates for each layer.

At block 408, the process of block 406 is repeated, e.g., with each subsequent metallic layer having a magnetic anisotropy aligned in the same direction as that of each previous metallic layer. Article 22 may be sintered and/or annealed after being built by additive manufacturing using system 10. The process of flowchart 400 ends at block 410.

In some embodiments, the processes of blocks 404-408 may be performed to create an article 22 in the form of a continuous flux collector ring. For example, referring also to FIGS. 10A and 10B, a flux collector ring, such as those described herein, and other flux collectors, such as linear flux collectors, collect stray flux 118, e.g., created by windings, such as low voltage (LV) windings 120 and high voltage (HV) windings 122 in a transformer 124, and direct the flux to the core 126 of the transformer 124. For a flux collector ring of this type, the magnetic anisotropy 130 is preferably radial in direction, e.g., the radially inward direction, and may also be circumferential, e.g., because the <001>, <010> and <100> crystallographic axes corresponding to the easy magnetization directions are mutually perpendicular. Because the magnetic reluctance is lower in these directions, more stray flux is transferred to the core than flux collector rings or other flux collectors that do not have the controlled and directional magnetic anisotropy, i.e., the radial lines of magnetic anisotropy 130.

Figure 10B:
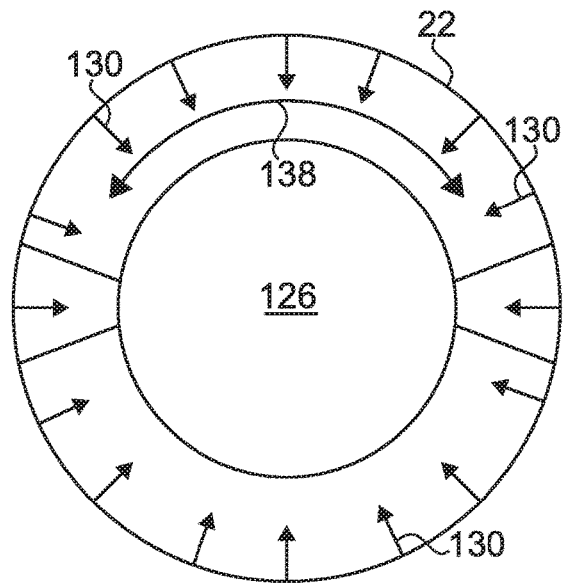
FIGS. 10A and 10B schematically illustrate some aspects of a non-limiting example of a flux collector ring in a transformer in accordance with an embodiment of the present invention.
Figure 10A:
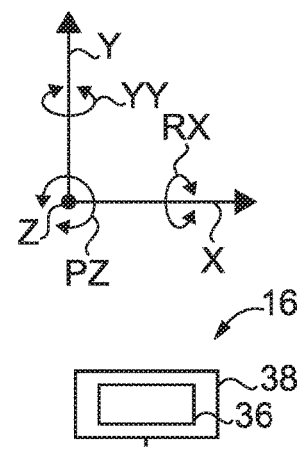
Figure 10A:
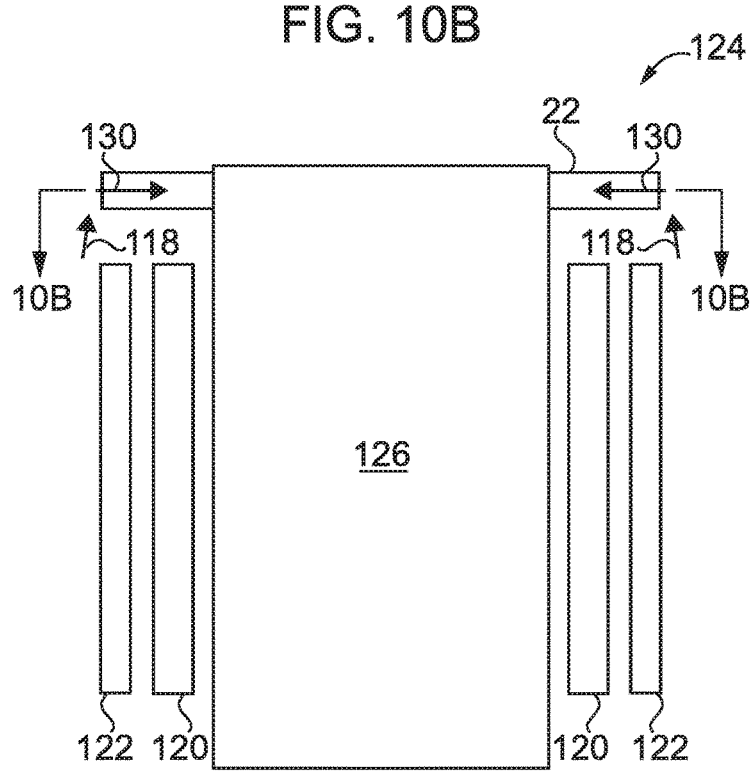
Figure 11:
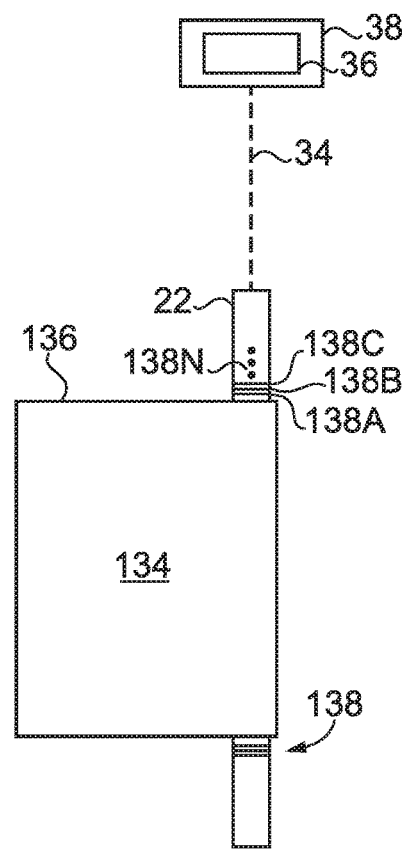
FIG. 11 schematically illustrates some aspects of a non-limiting example of a system for performing additive manufacturing to generate an article having magnetic anisotropy aligned in one or more desired directions in accordance with an embodiment of the present invention.

Referring also to FIG. 11 in conjunction with FIG. 1, the article 22 in the form of a continuous flux collector ring 22 of FIGS. 10A and 10B may be additively manufactured by using the steps of flowchart 400 of FIG. 9, wherein build platform 14 takes the form of a mandrel 134, wherein the build surface 32 is the surface 136 of mandrel 134, e.g., a cylindrical surface, although any other suitable surface shape may be employed in other embodiments. In some embodiments, mandrel 134 may have the same size or shape as core 126 or may have a diameter sized to circumscribe core 126. System 10 may be constructed to rotate mandrel 134 360°, continuously or incrementally, e.g., about the X axis in roll direction RX. The first metallic layer, e.g., layer 138A, may be built circumferentially about mandrel 134 using additive manufacturing, and each subsequent metallic layer 138B, 138C, etc. (further subsequent metallic layers being indicated by the vertical ellipsis 138N) may be built over a previous metallic layer. Each metallic layer 138 is thus a ring-shaped layer. The build parameters may be varied so that the crystallographic axes of the metallic crystals forming each layer 138 may be controlled to generate crystals having <001>, <010> or <100> crystallographic axis, each corresponding to an easy magnetization direction, aligned parallel with the build direction or build axis Y. Since mandrel 134 is controlled to rotate, e.g., after melting a line of powder extending in the X direction, the lines of magnetic anisotropy 130 extend in the radial direction through the flux collector ring. That is, the direction of magnetic anisotropy varies along a circumferential direction 138, and is perpendicular to the circumferential direction at each circumferential location through the article.

Figure 12B:
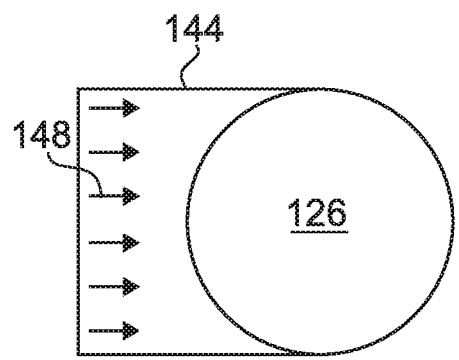
FIGS. 12A-12D schematically illustrate some aspects of non-limiting examples of a linear flux collectors formed by additive manufacturing in accordance with an embodiment of the present invention.
Figure 12C:
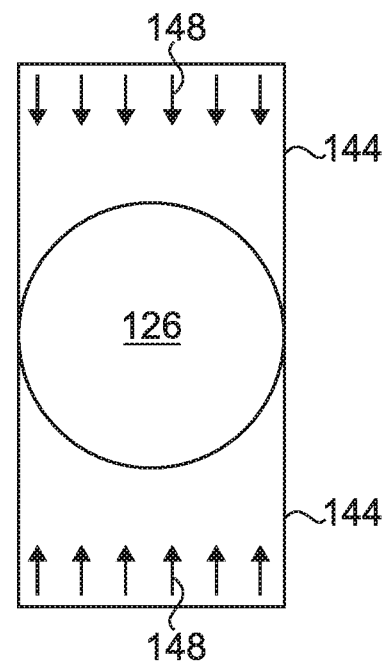
Figure 12A:
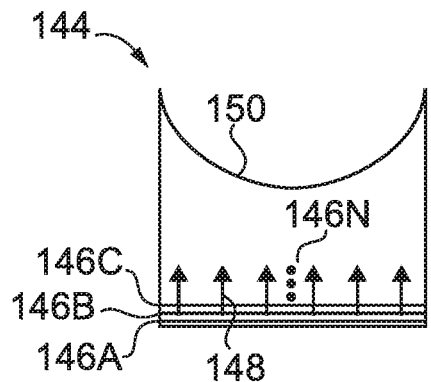
Figure 12D:
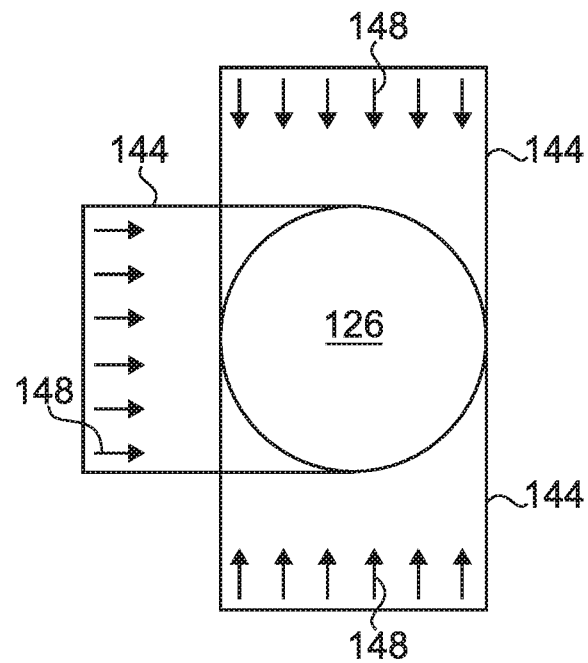

Referring also to FIGS. 12A-12D, the process of flowchart 400 of FIG. 9 may also be used to perform additive manufacturing to form one or more linear flux collectors 144 using system 10 of FIG. 1, wherein build platform 14 is not rotated or tilted between the formation of each metallic layer 146. Thus, each metallic layer, e.g., layers 146A, 146B, 146C, etc. (further subsequent metallic layers being indicated by the vertical ellipsis 146N) have a magnetic anisotropy 148 aligned in the same direction throughout the linear flux collector 144. In some embodiments, linear flux collectors 144 include a surface 150 constructed to correspond generally to the shape of the transformer core that the linear flux collector 44 is intended for use with, for mating engagement with the transformer core. In various embodiments, one or more linear flux collectors may be used at each flux collection location along the transformer core in each transformer, e.g., transformer core 126 (FIGS. 10A, 10B). For example, FIGS. 12B-12D illustrate quantities of one (1), two (2) and three (3) linear flux collectors 144 used in conjunction with transformer core 126

Embodiments of the present invention include a method for additive manufacturing of an article having a controlled magnetic anisotropy, comprising: forming a metallic layer of the article using additive manufacturing, the metallic layer having a magnetic anisotropy aligned in a first direction; forming a subsequent metallic layer of the article using additive manufacturing, the subsequent metallic layer having the magnetic anisotropy aligned in a second direction different from the first direction; and repeating the forming of subsequent metallic layers of the article to form at least a portion of the article, each subsequent metallic layer having the magnetic anisotropy aligned in a different direction than a previous metallic layer.

In a refinement, the method further comprises additive manufacturing the metallic layers to generate at least two portions of the article; and metallurgically bonding the at least two portions of the article together to form the article.

In another refinement, the method further comprises forming at least one metallic layer of the article using additive manufacturing, the at least one metallic layer having the magnetic anisotropy aligned in a same direction as the magnetic anisotropy of at least one previous metallic layer.

In yet another refinement, the method further comprises forming an insulating layer over at least one previous metallic layer; and additive manufacturing the subsequent metallic layer over the insulating layer.

In still another refinement, the forming of the insulating layer is additive manufacturing the insulating layer.

In yet still another refinement, the insulating layer is an electrically insulating layer.

In a further refinement, the electrically insulating layer is soda lime glass.

In a yet further refinement, wherein the metallic layer is an Fe—Si alloy.

In a still further refinement, the anisotropy of the portion of the article includes continuous two-dimensional lines anisotropy.

In a yet still further refinement, the anisotropy of the portion of the article includes continuous three-dimensional lines of anisotropy.

Embodiments of the present invention include a method for additive manufacturing of an article having a nonlinear magnetic anisotropy, comprising: depositing a layer of metal powder, the layer extending in a build direction; directing an energy beam at selected portions of the metal powder layer to melt the layer to form a metallic layer; controlling build parameters, the build parameters including a scan speed of the energy beam, an energy beam power density, a crystal growth rate, a thermal gradient, and a heat extraction to generate a crystal having a <001>, <010> or <100> crystallographic axis parallel to the build direction; rotating the build platform in a pitch and/or roll direction; and repeating the depositing, directing, controlling, and rotating to build a plurality of layers and generate at least a portion the article from the plurality of metallic layers.

In a refinement, the at least a portion of the article is a first portion of the article, further comprising generating a second portion of the article, and metallurgically bonding the first portion and the second portion together.

In another refinement, the energy beam is disposed substantially parallel to the build direction.

In yet another refinement, the method further comprises forming an electrically insulating layer over a previous metallic layer; and depositing a layer of metal powder on the electrically insulating layer and melting the layer of metal powder, wherein the portion of the article includes a plurality of electrically insulating layers alternatingly disposed between metallic layers.

In still another refinement, the forming of the electrically insulating layer is additive manufacturing the insulating layer.

Embodiments of the present invention include a method for additive manufacturing of an article having a nonlinear magnetic anisotropy, comprising: forming a metallic layer of the article using additive manufacturing, the metallic layer having a magnetic anisotropy aligned in a first direction and including an open slot extending at least partially through the metallic layer; forming a subsequent metallic layer of the article using additive manufacturing, the subsequent metallic layer having the magnetic anisotropy aligned in a second direction different from the first direction and including a subsequent open slot extending at least partially through the metallic layer; and repeating the forming of subsequent metallic layers of the article to form at least a portion of the article, each subsequent metallic layer having the magnetic anisotropy aligned in a different direction than a previous metallic layer, and each subsequent metallic layer including the subsequent open slot extending at least partially through each metallic layer.

In a refinement, each subsequent layer is built upon a previous metallic layer to form a stack of metallic layers; wherein the open slot of each layer is aligned with the open slots of a plurality of other metallic layers.

In another refinement, the method further comprises forming the stack of metallic layers with a magnetic anisotropy extending continuously through a plurality of the metallic layers.

In still another refinement, the method further comprises at least partially filling a plurality of the open slots with an electrical insulating material.

Embodiments of the present invention include an article of manufacture having a controlled magnetic anisotropy, comprising: a first metal structure formed of a first plurality of layers, each layer having a magnetic anisotropy defined by continuous curves extending in at least two dimensions between and through a multitude of the metallic layers.

In a refinement, the magnetic anisotropy is defined by continuous curves extending in at least three dimensions between and through a multitude of the metallic layers.

In another refinement, the method further comprises a second metal structure formed of second a plurality of layers, each layer of the second plurality of layers having the magnetic anisotropy defined by continuous curves extending in at least two dimensions between and through a multitude of the metallic layers, wherein the first metal structure is metallurgically bonded to the second metal structure.

In yet another refinement, the article is a flux collector ring having a circumferential magnetic anisotropy.

In still another refinement, the article is a rotor of an electrical machine.

Embodiments of the present invention include a method for additive manufacturing of an article having a controlled magnetic anisotropy, comprising: forming a metallic layer of the article using additive manufacturing, the metallic layer having a magnetic anisotropy aligned in a first direction; forming a subsequent metallic layer of the article using additive manufacturing, the subsequent metallic layer having the magnetic anisotropy aligned in a same direction as the first direction; and repeating the forming of subsequent metallic layers of the article to form at least a portion of the article, each subsequent metallic layer having the magnetic anisotropy aligned in a same direction as the first direction.

In a refinement, the first direction is a radial direction that varies along a circumferential direction and is perpendicular to the circumferential direction at each circumferential location throughout the article.

In another refinement, the method further comprises forming the metallic layer about a mandrel.

In yet another refinement, the method further comprises forming a flux collector ring.

In still another refinement, the method further comprises forming a linear flux collector.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A method for additive manufacturing of an article having a controlled magnetic anisotropy, comprising:
   forming a metallic layer of the article using additive manufacturing according to build parameters in a first build direction, the metallic layer having a magnetic anisotropy aligned in a first direction parallel to the first build direction;
   varying the build parameters to form a subsequent metallic layer of the article using additive manufacturing in a second build direction, the subsequent metallic layer having the magnetic anisotropy aligned in a second direction different from the first direction, the second direction being parallel to the second build direction, wherein the first direction and the second direction are selectively changed based on the variation of the build parameters used in the additive manufacturing to form the metaling layer and the subsequent layer; and
   repeating the forming of subsequent metallic layers of the article and the variation of the build parameters to form at least a portion of the article, each subsequent metallic layer having the magnetic anisotropy aligned in a different direction than a previous metallic layer.

2. The method of claim 1, further comprising:
   additive manufacturing the metallic layers to generate at least two portions of the article; and
   metallurgically bonding the at least two portions of the article together to form the article.

3. The method of claim 1, further comprising forming at least one metallic layer of the article using additive manufacturing, the at least one metallic layer having the magnetic anisotropy aligned in a same direction as the magnetic anisotropy of at least one previous metallic layer.

4. The method of claim 1, further comprising forming an insulating layer over at least one previous metallic layer; and additive manufacturing the subsequent metallic layer over the insulating layer.

5. The method of claim 4, wherein the forming of the insulating layer is additive manufacturing the insulating layer.

6. The method of claim 4, wherein the insulating layer is an electrically insulating layer.

7. The method of claim 4, wherein the electrically insulating layer is soda lime glass.

8. The method of claim 1, wherein the metallic layer is an Fe—Si alloy.

9. The method of claim 1, wherein the anisotropy of the portion of the article includes continuous two-dimensional lines anisotropy.

10. The method of claim 1, wherein the anisotropy of the portion of the article includes continuous three-dimensional lines of anisotropy.

11. The method of claim 1, wherein each metallic layer is formed to include an open slot extending at least partially therethrough.

12. The method of claim 11, wherein the open slot of each metallic layer is formed to align with the open slots of a plurality of other metallic layers.

13. The method of claim 12, wherein the metallic layers are formed so the magnetic anisotropy extends continuously through the metallic layers.

14. The method of claim 11, further comprising at least partially filling a plurality of the open slots with an electrical insulating material.

15. The method of claim 1, wherein the magnetic anisotropy of each metallic layer is defined by continuous curves extending in at least two dimensions between and through the metallic layers.

16. The method of claim 1, wherein the magnetic anisotropy of each metallic layer is defined by continuous curves extending in at least three dimensions between and through the metallic layers.

17. The method of claim 1, wherein repeating the forming of subsequent metallic layers of the article forms a flux collector having a circumferential magnetic anisotropy.

18. The method of claim 1, wherein repeating the forming of subsequent metallic layers of the article forms a rotor of an electrical machine.

19. The method of claim 1, wherein the build parameters are varied so that crystallographic axes of metallic crystals forming the metallic layer are controlled to generate crystals having a <001>, <010> or <100> crystallographic axis, each corresponding to an easy magnetization direction, aligned parallel with the build direction, thereby orienting the second direction of the magnetic anisotropy with the build direction for the subsequent layer.

20. The method of claim 1, wherein the build parameters comprise a direction of an energy beam, a heat extraction rate and/or direction, a layer thickness, a mean particle size of the metallic powder, a scan speed of the energy beam, power density, energy beam diameter or dimension/width, crystal growth rate or layer growth rate, and a thermal gradient.

21. The method of claim 1, wherein the metallic layer is formed on a platen, and wherein the build parameters include a pitch, yaw, and/or an angular rotation position of the platen.

22. A method for additive manufacturing of an article having a controlled magnetic anisotropy, comprising:
forming a metallic layer of the article using additive manufacturing, the metallic layer having a magnetic anisotropy aligned in a first direction that is a radial inward direction;
forming a subsequent metallic layer of the article using additive manufacturing, the subsequent metallic layer having the magnetic anisotropy aligned in a same direction as the first direction; and
repeating the forming of subsequent metallic layers of the article to form at least a portion of the article, each subsequent metallic layer having the magnetic anisotropy aligned in a same direction as the first direction.

23. The method of claim 22, wherein the radial direction is perpendicular to a circumferential direction at each circumferential location throughout the article and the direction of magnetic anisotropy varies along the circumferential direction.

24. The method of claim 22, wherein the method further comprises forming the metallic layer about a mandrel.

25. The method of claim 24, further comprising forming a flux collector ring with the formed metallic layers having the magnetic anisotropy aligned in the first direction.

26. The method of claim 22, further comprising forming a linear flux collector with the formed metallic layers having the magnetic anisotropy aligned in the first direction.

27. The method of claim 22, wherein each metallic layer is formed to include an open slot extending at least partially therethrough.

28. The method of claim 27, wherein the open slot of each metallic layer is with the open slots of a plurality of other metallic layers.

29. The method of claim 28, wherein the metallic layers are formed so the magnetic anisotropy extends continuously through the metallic layers.

30. The method of claim 27, further comprising at least partially filling a plurality of the open slots with an electrical insulating material.

31. The method of claim 22, wherein the magnetic anisotropy of each metallic layer is defined by continuous curves extending in at least two dimensions between and through the metallic layers.

32. The method of claim 22, wherein the magnetic anisotropy of each metallic layer is defined by continuous curves extending in at least three dimensions between and through the metallic layers.

* * * * *